(12) United States Patent
Nakabayashi et al.

(10) Patent No.: US 6,621,123 B1
(45) Date of Patent: Sep. 16, 2003

(54) SEMICONDUCTOR DEVICE, AND SEMICONDUCTOR INTEGRATED DEVICE

(75) Inventors: Takashi Nakabayashi, Osaka (JP); Chiaki Kudo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/576,436

(22) Filed: May 22, 2000

Related U.S. Application Data

(62) Division of application No. 08/872,335, filed on Jun. 10, 1997, now Pat. No. 6,093,592.

(30) Foreign Application Priority Data

Jun. 12, 1996 (JP) ............................................. 8-150624

(51) Int. Cl.[7] ........................... H01L 27/01; H01L 29/76
(52) U.S. Cl. ..................... 257/347; 257/407; 257/412; 257/336; 257/337; 438/151; 438/166; 438/287; 438/300
(58) Field of Search ............................... 257/347, 407, 257/412, 401, 336, 337, 344, 408; 438/151, 166, 287, 300, 208, 221, 296, 297

(56) References Cited

U.S. PATENT DOCUMENTS

| 4,277,883 | A | | 7/1981 | Kaplan |
| 4,523,213 | A | * | 6/1985 | Konaka et al. ............ 357/23.7 |
| 4,788,663 | A | * | 11/1988 | Tanaka et al. .............. 365/185 |
| 4,879,585 | A | * | 11/1989 | Usami ........................ 357/49 |
| 5,212,109 | A | | 5/1993 | Mihara |
| 5,315,144 | A | * | 5/1994 | Cherne ........................ 257/351 |
| 5,541,430 | A | | 7/1996 | Terashima |
| 5,654,573 | A | * | 8/1997 | Oashi et al. ................ 257/349 |
| 5,686,755 | A | * | 11/1997 | Malhi ......................... 257/492 |
| 5,747,828 | A | * | 5/1998 | Hata et al. .................... 257/66 |
| 5,796,166 | A | * | 8/1998 | Agnello et al. ............. 257/751 |
| 5,892,256 | A | * | 4/1999 | Matsushita et al. ......... 257/301 |
| 5,930,642 | A | * | 7/1999 | Moore et al. ............... 438/407 |
| 5,969,396 | A | * | 10/1999 | Iwasa et al. ................ 257/408 |
| 6,091,123 | A | * | 7/2000 | Krivokapic et al. ........ 257/412 |

FOREIGN PATENT DOCUMENTS

| FR | 2617642 A | * | 1/1989 |
| JP | 8-18054 | | 1/1966 |
| JP | 03-96278 | | 4/1991 |
| JP | 07-211902 | | 8/1995 |

* cited by examiner

*Primary Examiner*—Tom Thomas
*Assistant Examiner*—Donghee Kang
(74) *Attorney, Agent, or Firm*—McDermott, Will & Emery

(57) ABSTRACT

On a semiconductor substrate of P-type silicon, an active area including a channel forming region with a smaller dimension along the gate width and a source region and a drain region extending along the gate length is formed so as to be surrounded with an isolation area of an insulating oxide film. On the isolation area on the semiconductor substrate and the channel forming region of the active area, a gate electrode is formed with a gate insulating oxide film sandwiched therebetween. A channel lower insulating layer is formed, out of the same insulating oxide film for the isolation area, merely in an area below the channel forming region below the gate electrode in the active area of the semiconductor substrate.

8 Claims, 12 Drawing Sheets

SEMICONDUCTOR DEVICE, AND SEMICONDUCTOR INTEGRATED DEVICE

This application is a Divisional of application Ser. No. 08/872,335 filed on Jun. 10, 1997, now U.S. Pat. No. 6,093,592.

BACKGROUND OF THE INVENTION

The present invention relates to a MOS transistor having an SOI structure, and a method of manufacturing the MOS transistor.

In accordance with recent refinement of a semiconductor device, a large scale integrated circuit (LSI) with integration of five million or more transistors has been developed. Such high integration is indispensable to increase the operation speed of a parallel processor and the like, and is more and more accelerated in accordance with increase in functions of an LSI. As the number of integrated devices is increased, however, the power consumption is also increased. Therefore, there are increasing demands for decrease in the power consumption.

The most effective technique to decrease the power consumption of an LSI is reduction of a supply voltage so as to decrease a leakage voltage. In a generation with a design rule of 0.35 $\mu$m through 0.5 $\mu$m, a voltage of 5 V through 3 V has been conventionally adopted, but the supply voltage is expected to be further decreased. However, since the reduction of the supply voltage degrades a driving ability of a transistor, in order to compensate the degradation of the driving ability simultaneously with pursuit of the higher operation speed, scaling of a transistor is also required.

In the scaling of a transistor, reduction of the gate length has been the most significant parameter for the higher operation speed. Additionally, as a result of the reduction of the supply voltage, scaling of a threshold voltage has also become a significant problem. The threshold voltage of a silicon MOS transistor is conventionally set at approximately 0.6 V. This voltage is comparatively small as compared with the supply voltage, and hence has been scarcely changed through generations. However, when the supply voltage is decreased to, for example, approximately 1.5 V, corresponding to a voltage of one dry battery, the proportion of the threshold voltage to the supply voltage is very large. Also, the saturation current value of a transistor is in proportion to a square of a difference between the supply voltage and the threshold voltage. In view of this, the scaling of the threshold voltage is indispensable.

The threshold voltage is a significant parameter corresponding to the subthreshold characteristic of a MOS transistor, and has strong correlation with an off-leakage current. As is shown in FIG. 13, as the threshold voltage is decreased, the off-leakage current is largely increased. This is a fatal disadvantage to portable equipment, and means that the threshold voltage cannot be simply decreased. Accordingly, there is a demand for a technique to decrease the threshold voltage for the higher operation speed without increasing the off-leakage current.

As a countermeasure against this problem, an SOI (silicon on insulator) structure is regarded to be most promising.

The SOI structure has a characteristic that spread of a depletion layer from a drain diffused layer can be suppressed by forming a buried layer out of an oxide film in a silicon substrate. Therefore, an impurity concentration of a channel region in the semiconductor substrate directly below a gate electrode can be made low, resulting in increasing the gradient of the subthreshold characteristic. For example, a normal MOS transistor has a subthreshold slope, that is, an inverse of the subthreshold characteristic, of 80 mV/dec through 90 mV/dec, whereas an SOI transistor has a subthreshold slope as small as approximately 65 mV/dec. Thus, the threshold voltage can be decreased without increasing the off-leakage current in the SOI transistor.

An SOI substrate is conventionally manufactured by, for example, a SIMOX method in which oxygen is injected into a substrate so as to directly form a buried oxide film in the substrate, a wafer bonding method in which a silicon substrate and an oxide film substrate are adhered to each other.

However, the SIMOX method has problems that the injected oxygen can remain in an upper silicon layer (SOI) and that a damage such as lattice defect can be caused in crystal by the injected oxygen. The wafer bonding method is disadvantageous in difficulty in control of the thickness of the SOI film. Also, both in the SIMOX method and the wafer bonding method, a leakage current can be caused between the source and the drain due to an interfacial level occurring on the interface between the buried oxide film and the SOI film, so that the electric characteristic of the transistor can be disadvantageously degraded.

Furthermore, in a transistor using the SOI substrate, a potential breakdown is caused between the source diffused layer and the channel region due to injected holes, so that a kink phenomenon can be easily caused. Moreover, the SOI substrate itself is disadvantageously expensive.

As described so far, there are a large number of problems in realizing an LSI including an SOI substrate.

SUMMARY OF THE INVENTION

In view of the aforementioned conventional disadvantages, the object of the invention is realizing a MOS transistor having an SOI structure without using an SOI substrate.

For the purpose of achieving this object, according to the invention, a channel lower insulating layer working as a buried oxide film is formed merely in an area below a channel region in a semiconductor substrate.

The semiconductor device of this invention comprises a semiconductor substrate including a source region and a drain region formed with a distance from each other; a gate electrode formed on the semiconductor substrate between the source region and the drain region; and a channel lower insulating layer formed below a channel region formed below the gate electrode, and in this semiconductor device, the channel lower insulating layer is formed with a distance from an isolation area disposed at both sides thereof along a gate length.

In this semiconductor device, the channel lower insulating layer formed below the channel region below the gate electrode is away from the isolation area disposed at both sides of the channel lower insulating layer along the gate length. Therefore, when a gate bias is applied, a depletion layer formed in the channel region is suppressed from spreading from the drain region, resulting in shortening time required for forming a channel in the channel region. Accordingly, an impurity concentration in the channel region can be made low, and hence, the capacitance of the depletion layer is decreased and the gradient of the subthreshold characteristic can be enlarged. As a result, the threshold voltage can be decreased without increasing the off-leakage current. Thus, low voltage drive can be realized without using an SOI substrate, and power consumption can be also decreased.

In one aspect of the semiconductor device, the channel lower insulating layer is preferably formed in a manner that the channel region is connected with an area below the channel lower insulating layer in the semiconductor substrate. In this manner, the channel lower insulating layer can be formed so as to connect the channel region with the area below the channel lower insulating layer in the semiconductor substrate. Therefore, even when an interfacial level is caused on the interface between a semiconductor layer included in the semiconductor substrate and the channel lower insulating layer, a leakage current can be prevented from flowing between the source and the drain. Furthermore, injected holes can flow to the lower portion of the semiconductor substrate, and hence, a potential breakdown is scarcely caused between the source or drain region and the channel region. Accordingly, it is possible to suppress occurrence of the kink phenomenon and the like, resulting in improving the electric characteristic of the device.

The semiconductor integrated device of this invention comprises a first semiconductor device and a second semiconductor device formed on one semiconductor substrate, and in this semiconductor integrated device, the first semiconductor device includes a first gate electrode formed on the semiconductor substrate; a first active area formed on the semiconductor substrate to be surrounded with an isolation area, the first active area including a first channel forming region with a smaller dimension along a gate width disposed below the first gate electrode, and a first source region and a first drain region extending along a gate length; and a channel lower insulating layer formed in an area below the first channel forming region with a distance from the isolation area disposed at both sides thereof along the gate length, and the second semiconductor device includes a second gate electrode formed on the semiconductor substrate; and a second active area formed on the semiconductor substrate, including a second channel forming region disposed below the second gate electrode with a larger dimension along the gate width than the first channel forming region, and a second source region and a second drain region extending along the gate length.

In this semiconductor integrated device, since the first semiconductor device includes the channel lower insulating layer formed in the area below the first channel forming region so as to be away from the isolation area disposed at both sides thereof along the gate length, time required for forming a channel in the channel region can be shortened. Therefore, an impurity concentration in the first channel forming region can be made low, and hence, the capacitance of a depletion layer can be decreased and the gradient of the subthreshold characteristic can be enlarged. Thus, the threshold voltage can be decreased without increasing the off-leakage current. In this manner, low voltage drive can be realized without using an SOI substrate. On the other hand, the second semiconductor device, formed on the same semiconductor substrate as the first semiconductor device and including the second active area, has a large drive current because its gate width is larger than that of the first semiconductor device. Furthermore, when the second semiconductor device includes, similarly to the first semiconductor device, the channel lower insulating layer below the second channel forming region with a smaller dimension along the gate width, the second semiconductor device has a different gate width from that of the first semiconductor device. Therefore, the thicknesses of the channel forming regions in these semiconductor devices are different from each other, resulting in causing a difference in the threshold voltage between the first and second semiconductor devices. Accordingly, when the first and second semiconductor devices having the different threshold voltages are combined on the same semiconductor substrate, or when the first semiconductor device applicable to low voltage drive and the second semiconductor device with a large drive current are appropriately combined on the same semiconductor substrate, the advantages of both the first and second semiconductor devices can be effectively utilized.

The method of manufacturing a semiconductor device of this invention comprises the steps of forming, on a semiconductor substrate, a mask pattern for masking an active area including a channel forming region with a smaller dimension along a gate width and a source region and a drain region extending along a gate length; forming an opening extending along the gate width in an area below the channel forming region in the semiconductor substrate by etching the semiconductor substrate with the mask pattern used, in a manner that the semiconductor substrate is largely removed toward a lower portion thereof; forming a channel lower insulating layer by filling the opening in the semiconductor substrate with an insulating film, and forming an isolation area of an insulating film around the active area; and forming a gate electrode in the channel forming region on the semiconductor substrate.

In this method of manufacturing a semiconductor device, the channel lower insulating layer is formed by filling, with the insulating film, the opening formed through etching in the area below the channel forming region below the gate electrode in the semiconductor substrate. Therefore, when a gate bias is applied, the channel lower insulating layer can suppress spread of a depletion layer formed in the channel region. As a result, time required for forming a channel in the channel region can be shortened. Accordingly, an impurity concentration in the channel forming region can be made low, and hence, the capacitance of the depletion layer can be decreased and the gradient of the subthreshold characteristic can be enlarged. Thus, the threshold voltage can be decreased without increasing the off-leakage current. In this manner, low voltage drive can be realized without using an SOI substrate, and power consumption can be also decreased.

In one aspect of the method of manufacturing a semiconductor device, the semiconductor substrate preferably has the (100) surface orientation, and wet etching is preferably adopted in etching the semiconductor substrate. In this manner, the opening extending along the gate width can be definitely formed merely in the area below the channel forming region with a smaller dimension along the gate width in the semiconductor substrate. Therefore, the channel lower insulating layer can be definitely formed merely in the area below the channel forming region.

BRIEF DESCRIPTION OF THE DRAWINGS

FIGS. 3(a) through 3(c) show the sectional structure of the semiconductor device of the first embodiment, wherein FIG. 3(a) is a sectional view taken on line IIIa—IIIa of FIG. 1, FIG. 3(b) is a sectional view taken on line IIIb—IIIb of FIG. 1 and FIG. 3(c) is a sectional view taken on line IIIc—IIIc of FIG. 1;

FIGS. 9(a) and 9(b) illustrate a semiconductor integrated device according a third embodiment of the invention, wherein FIG. 9(a) is a diagram of an active area mask pattern and a gate electrode mask pattern used for the semiconductor integrated device and FIG. 9(b) is a sectional view taken on line IXb—IXb of FIG. 9(a);

FIGS. 11(a) through 11(c) illustrate a semiconductor integrated device according to a modification of the third embodiment, wherein FIG. 11(a) is a plan view thereof, FIG. 11(b) is a sectional view taken on line XIb—XIb of FIG. 11(a) and FIG. 11(c) is a diagram for showing subthreshold characteristics respective devices therein;

DETAILED DESCRIPTION OF THE INVENTION (Embodiment 1)

A first embodiment of the invention will now be described with reference to the accompanying drawings.

Figure 1:
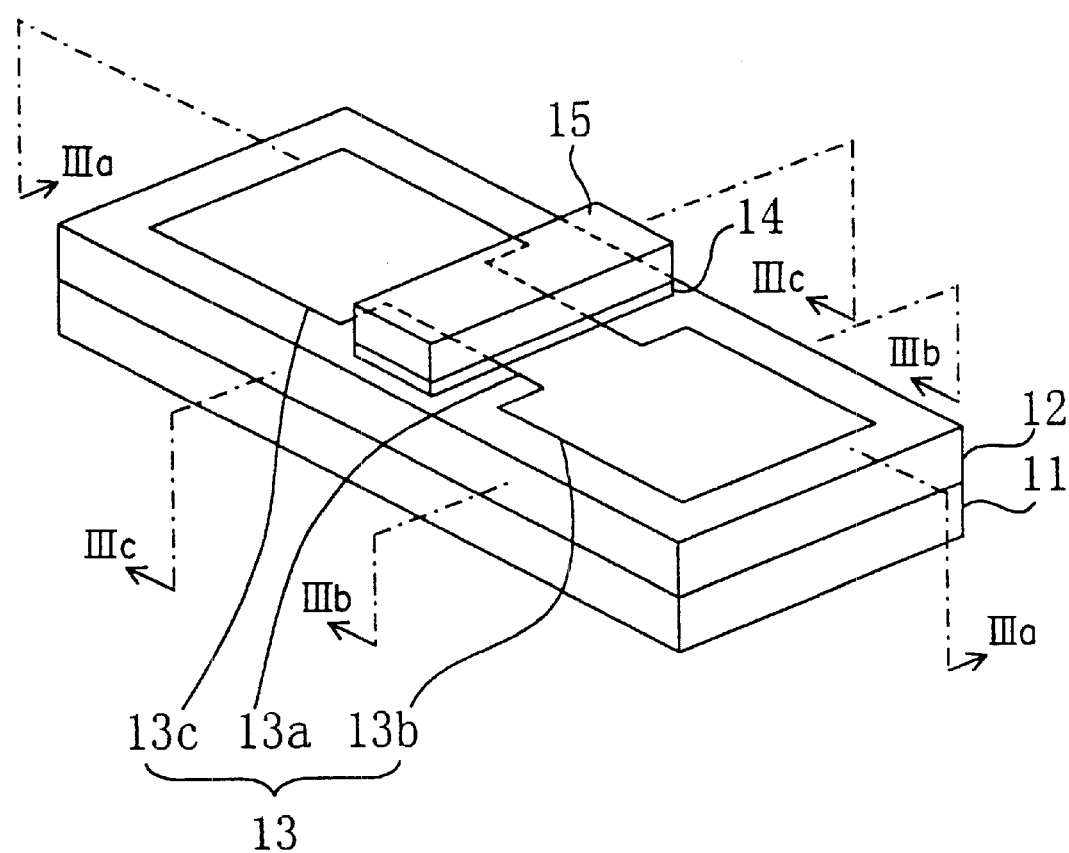
FIG. 1 is a perspective view of a semiconductor device according to a first embodiment of the invention.

FIG. 1 is a perspective view of an N-channel MOS transistor as a semiconductor device of the first embodiment. On a semiconductor substrate 11 of P-type silicon, an active area 13, including a channel forming region 13a with a smaller dimension along the gate width and a source region 13b and a drain region 13c extending along the gate length, is formed so as to be surrounded with an isolation area 12 of an insulating oxide film. On the isolation area 12 on the semiconductor substrate 11 and the channel forming region 13a of the active area 13, a gate electrode 15 is formed with a gate insulating oxide film 14 sandwiched therebetween.

Figure 2A:
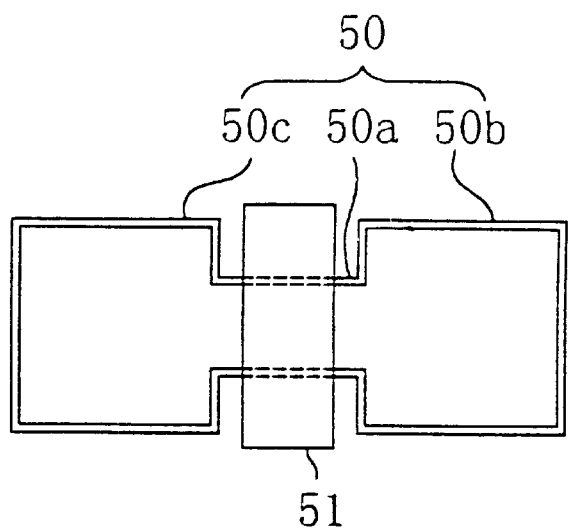
FIG. 2(a) is a plan view of a mask pattern used for the semiconductor device of the first embodiment.

FIG. 2(a) shows a mask pattern for the semiconductor device of this embodiment, wherein a reference numeral 50 denotes an active area mask pattern including a channel forming region portion 50a, a source region portion 50b and a drain region portion 50c, and a reference numeral 51 denotes a gate electrode mask pattern.

Figure 3A:
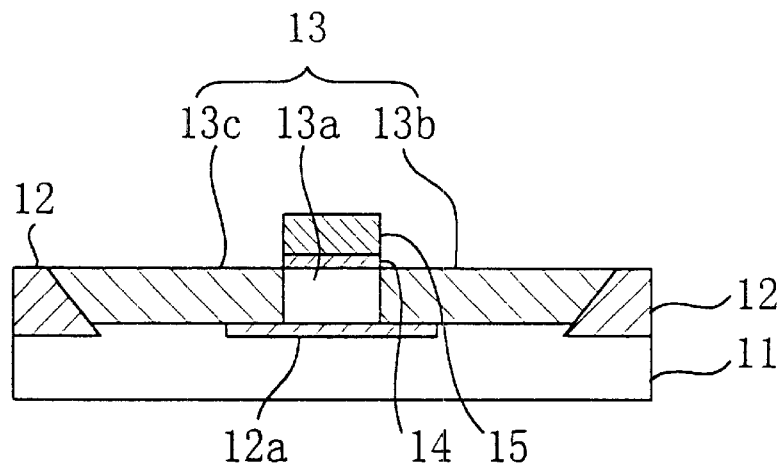
Figure 3B:
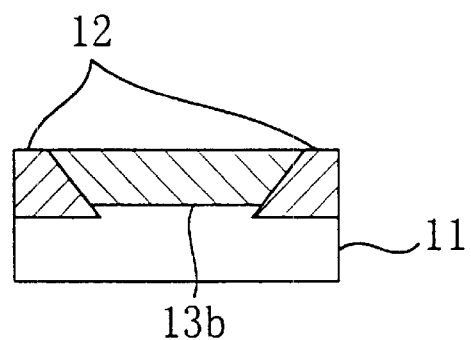
Figure 3C:
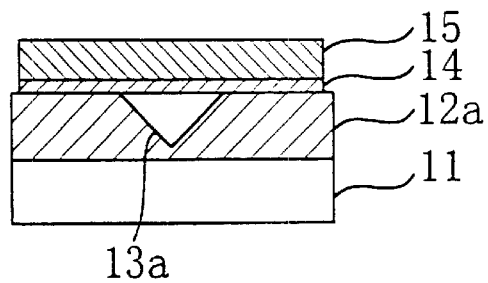

FIGS. 3(a) through 3(c) are sectional views of the semiconductor device of this embodiment, wherein FIG. 3(a) shows a section taken on line IIIa—IIIa of FIG. 1, namely, a section along the gate length, FIG. 3(b) shows a section taken on line IIIb—IIIb of FIG. 1, namely, a section of the source region 13b along the gate width, and FIG. 3(c) shows a section taken on line IIIc—IIIc of FIG. 1, namely, a section of the channel forming region 13a below the gate electrode 15 along the gate width. In FIGS. 3(a) through 3(c), like reference numerals are used to refer to like elements shown in FIG. 1, and the description is omitted.

As is shown in FIG. 3(a), the active area 13 of the semiconductor substrate 11 is formed to have a smaller dimension toward the lower portion of the semiconductor substrate 11, namely, in a so-called reverse taper form. In an area below the channel forming region 13a below the gate electrode 15, a channel lower insulating layer 12a of the same insulating oxide film as that for the isolation area 12 is formed with a distance from the isolation area 12 at the both sides thereof along the gate length. Furthermore, as is shown in FIG. 3(b), the isolation area 12 is formed integrally with and at both sides of the source region 13b of the active area 13 along the gate width. The channel lower insulating layer 12a is not formed below the source region 13b. Also, as is shown in FIG. 3(c), the section of the channel forming region 13a of the active area 13 along the gate width has a reverse triangle shape with its apex closer to the lower portion of the semiconductor substrate 11. The channel lower insulating layer 12a is filled between the semiconductor substrate 11 and the apex of the channel forming region 13a.

In this embodiment, the dimension, along the gate length, of the channel forming region portion 50a of the active area mask pattern 50 of FIG. 2(a) influences the dimension, along the gate length, of the channel lower insulating layer 12 of the isolation area 12 shown in FIG. 3(a).

Moreover, an area where the gate electrode 15 and the active area 13 are overlapped with each other (corresponding to the channel forming region 13a in this embodiment) in a MOS transistor is herein designated as a channel region.

As described above, in this embodiment, the channel lower insulating layer 12a of the insulating oxide film is formed merely in the area below the channel forming region 13a below the gate electrode 15 in the active area 13 of the semiconductor substrate 11. Therefore, when a bias voltage is applied to the device, a depletion layer formed in the channel region can be suppressed from spreading. As a result, time required for forming a channel in the channel region can be shortened, and hence, an impurity concentration in the channel region can be set at a smaller value. Accordingly, when the impurity concentration in the channel region is small, the capacitance of the depletion layer can be decreased, so as to enlarge the gradient of the subthreshold characteristic. Thus, the threshold voltage can be decreased without increasing an off-leakage current. In this manner, low voltage drive can be realized without using an SOI substrate, resulting in decreasing power consumption of the device.

Now, a method of manufacturing the semiconductor device having the aforementioned structure will be described with reference to the accompanying drawings.

FIGS. 4(a) through 4(d), 5(a) through 5(d) and 6(a) through 6(d) are sectional views for showing the manufacturing procedures for the semiconductor device of this embodiment, wherein FIGS. 4(a) through 4(d) show the section taken on line IIIa—IIIa of FIG. 1, FIGS. 5(a) through 5(d) show the section taken on line IIIb—IIIb of FIG. 1, and FIGS. 6(a) through 6(d) show the section taken on line IIIc—IIIc of FIG. 1.

Figure 4A:
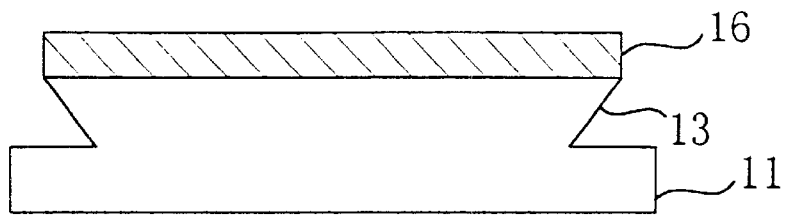
FIGS. 4(a) through 4(d) are sectional views for showing manufacturing procedures for the semiconductor device of the first embodiment, taken on line IIIa—IIIa of FIG. 1.
Figure 5A:
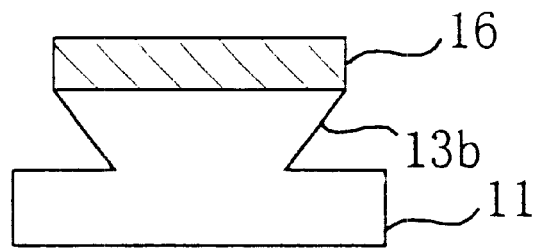
FIGS. 5(a) through 5(d) are sectional views for showing the manufacturing procedures for the semiconductor device of the first embodiment, taken on line IIIb—IIIb of FIG. 1.
Figure 6A:
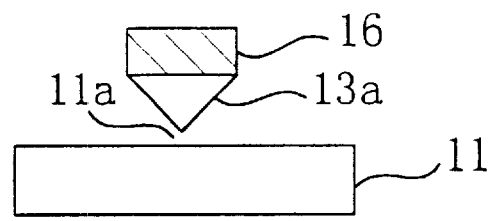
FIGS. 6(a) through 6(d) are sectional views for showing the manufacturing procedures for the semiconductor device of the first embodiment, taken on line IIIc—IIIc of FIG. 1.

First, as is shown in FIGS. 4(a), 5(a) and 6(a), on the semiconductor substrate 11 of P-type silicon with the (100) surface orientation, a silicon oxide film 16 with a thickness of, for example, 100 nm is formed, and the silicon oxide film 16 is etched by photolithography, thereby patterning the silicon oxide film 16 into the active area mask pattern 50 of FIG. 2(a). Then, by using the patterned silicon oxide film 16 as a mask, wet etching is effected on the semiconductor substrate 11 with an aqueous solution of potassium hydroxide or ethylene diamine. The etching of the semiconductor substrate 11 is conducted selectively along the (111) crystal orientation, so that the section of the channel forming region 13a along the gate width can be made into the reverse taper form with a smaller dimension toward the lower portion of the semiconductor substrate 11 as is shown in FIG. 6(a). Therefore, one etched surface on one side of the channel forming region 13a, having a smaller dimension along the gate width than the remaining active area 13, and another etched surface on another side thereof ultimately cross each other. The wet etching is further continued until the semiconductor substrate 11 is separated from the channel forming region 13a with an opening 11a extending along the gate width formed between the lower portion of the semiconductor substrate 11 and the channel forming region 13a. At this point, as is shown in FIG. 5(a), the source region 13b of the active area 13 is larger than the channel forming region 13a in the dimension along the gate width, and hence, the bottom of the source region 13b remains to be connected with the lower portion of the semiconductor substrate 11. Although not shown in the drawings, the bottom of the drain region 13c also remains to be connected with the lower portion of the semiconductor substrate 11. It is noted that the semiconductor substrate 11 can be etched by dry etching.

Figure 4B:
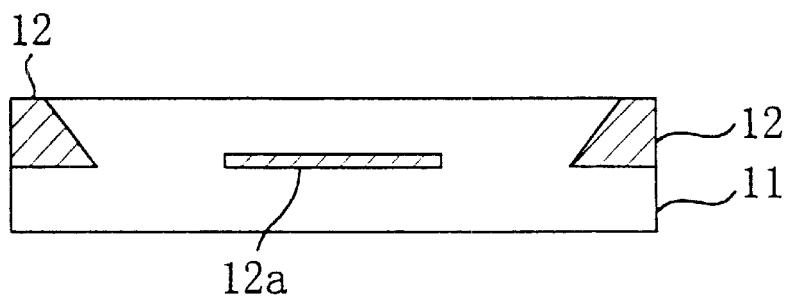
Figure 5B:
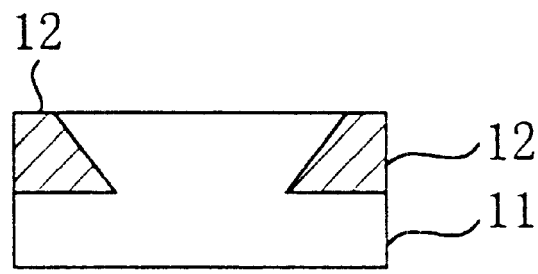
Figure 6B:
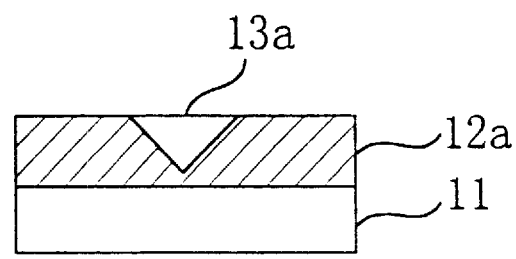

Next, as is shown in FIGS. 4(b), 5(b) and 6(b), after removing the silicon oxide film 16, an insulating oxide film is deposited on the entire surface of the semiconductor substrate 11, and the resultant top surface of the semiconductor substrate 11 is flattened by the CMP or etch back. In this manner, the channel lower insulating layer 12a is formed so as to fill the opening 11a, formed between the lower portion of the semiconductor substrate 11 and the channel forming region 13a of the active area 13, as well as the periphery of the opening 11a, and the isolation area 12 surrounding the active area 13 is formed. Before depositing the insulating oxide film, thermal oxidation can be effected.

Figure 4C:
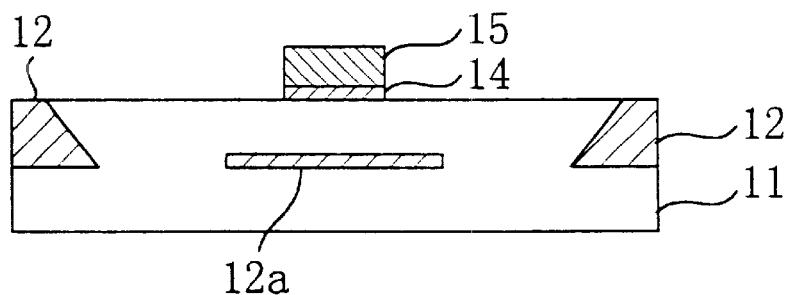
Figure 5C:
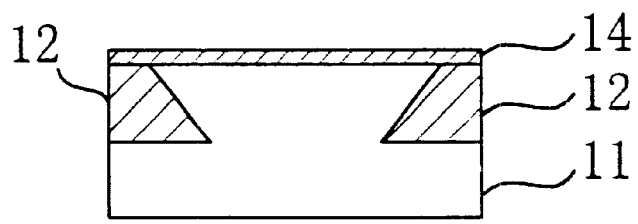
Figure 6C:
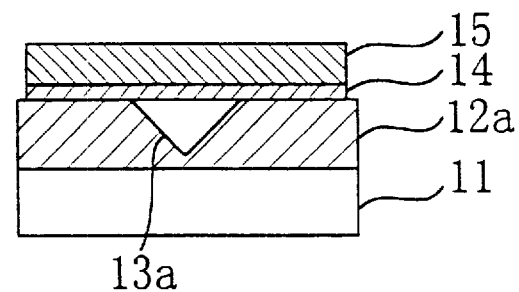

Then, as is shown in FIGS. 4(c), 5(c) and 6(c), boron ions for controlling the threshold voltage are implanted into the semiconductor substrate 11 at an implantation energy of 10 keV and a dose of $1 \times 10^{12}$ cm$^{-2}$. Then, an insulating oxide film with a thickness of 6 nm and a conductive film of N-type polycrystalline silicon with a thickness of 200 nm are successively deposited on the semiconductor substrate 11. After this, the insulating oxide film and the conductive film are etched by using the gate electrode mask pattern 51 of FIG. 2(a), thereby forming the gate insulating film 14 and the gate electrode 15.

Figure 4D:
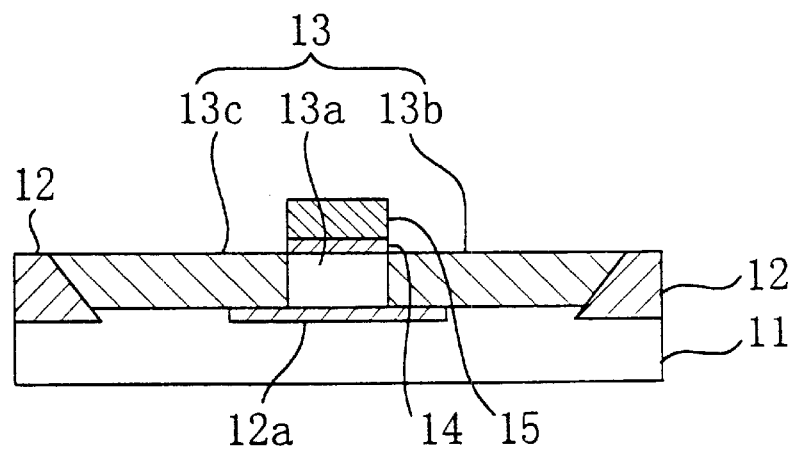
Figure 5D:
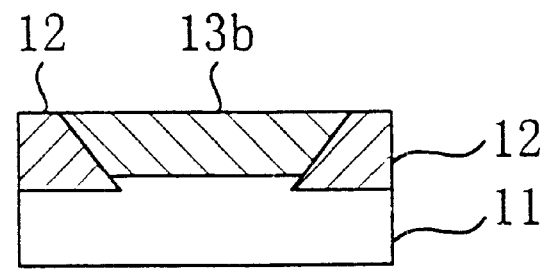
Figure 6D:
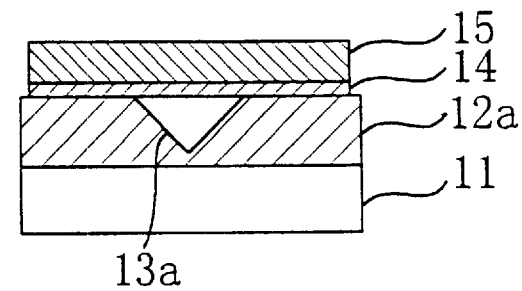

Subsequently, as is shown in FIGS. 4(d), 5(d) and 6(d), by using the gate electrode 15 as a mask, arsenic ions are implanted at an implantation energy of 10 keV and a dose of $3 \times 10^{15}$ cm$^{-2}$, and the resultant is annealed at a temperature of 850° C. for 30 minutes, thereby forming the source region 13b and the drain region 13c.

The thus manufactured semiconductor device comprises, as is shown in FIG. 4(d), the channel lower insulating layer 12a, of the same material as that for the isolation area 12, disposed below the channel forming region 13a of the active area 13 in the semiconductor substrate 11 so as to be away from the isolation area 12 at both sides thereof along the gate length. Thus, the semiconductor device attains the SOI structure in which a buried oxide film is formed merely in an area below the channel forming region 13a in the semiconductor substrate 11. Accordingly, as described above, the spread of the depletion layer from the drain region 13c can be suppressed without using an SOI substrate, and hence, the impurity concentration in the channel forming region 13a can be decreased and the capacitance of the gate depletion layer directly below the gate electrode 15 can be decreased. As a result, the gradient of the subthreshold characteristic can be enlarged, thereby decreasing the threshold voltage without increasing the off-leakage current.

(Embodiment 2)

A second embodiment of the invention will now be described with reference to the accompanying drawings.

Figure 7A:
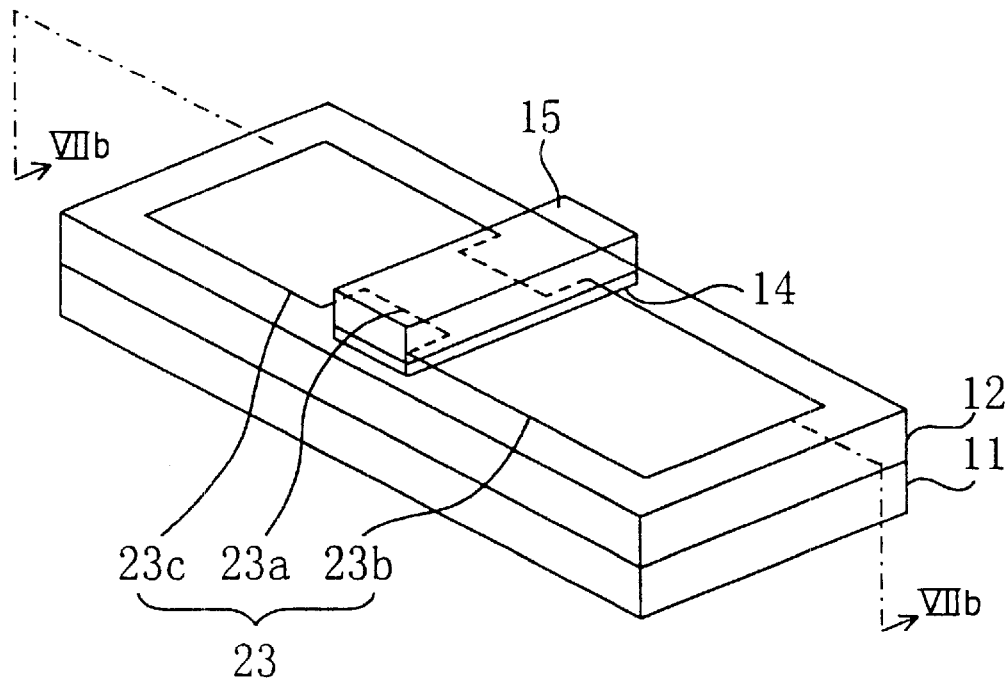
FIG. 7(a) is a perspective view of the semiconductor device of the second embodiment.
Figure 7B:
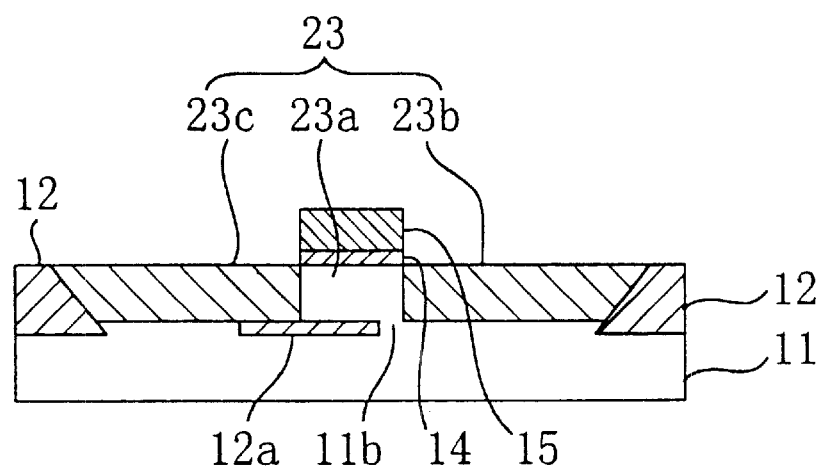
FIG. 7(b) is a sectional view taken on line VIIb—VIIb of FIG. 7(a)

FIG. 7(a) is a perspective view of an N-channel MOS transistor as a semiconductor device of this embodiment, and FIG. 7(b) is a sectional view taken on line VIIb—VIIb of FIG. 7(a). The semiconductor device of this embodiment is manufactured through the same procedures as those described in the first embodiment, and in FIG. 7(a), like reference numerals are used to refer to like elements shown in FIG. 1 and the description is omitted. As is shown in FIG. 7(a), an active area 23 in a semiconductor substrate 11 includes a channel forming region 23a with a smaller dimension along the gate width, and a source region 23b and a drain region 23c extending along the gate length. The active area 23 is formed by using an active area mask pattern 60 shown in FIG. 2(b) having a channel forming region portion 60a with a smaller dimension along the gate width, a source region portion 60b and a drain region portion 60c.

Figure 2B:
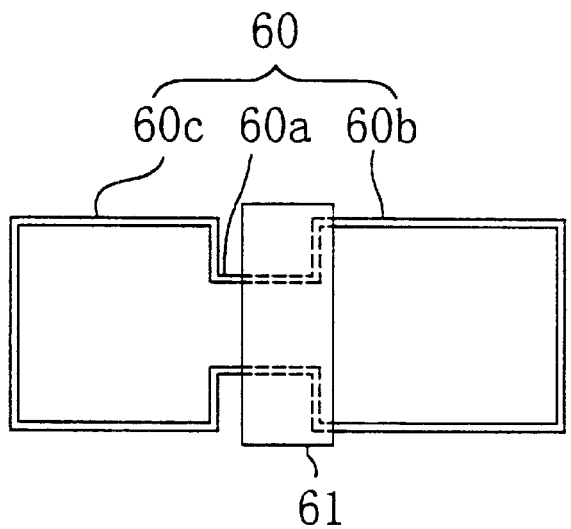
FIG. 2(b) is a plan view of a mask pattern used for a semiconductor device according to a second embodiment of the invention.

As a characteristic of this embodiment, the source region portion 60b of the active area mask pattern 60 and a gate electrode mask pattern 61 are overlapped with each other as is shown in FIG. 2(b). Therefore, a channel region is formed in an area where the active area mask pattern 60 and the gate electrode mask pattern 61 are overlapped with each other. As a result, the channel region has a larger channel width at its end closer to the source region portion 60b. Accordingly, as is shown in FIG. 7(b), a channel lower insulating layer 12a, which is formed below the channel forming region 23a of the active area 23 in the semiconductor substrate 11 simultaneously with an isolation area 12, is not connected with the source region 23b. This allows the channel forming region 23a in the semiconductor substrate 11 to be connected with an area below the channel lower insulating layer 12a through a channel region connecting portion 11b.

In a MOS transistor in general, a channel is formed on an interface between the gate electrode and the channel region, so that electrons can flow from the source region to the drain region and holes can be injected into the channel region below the gate electrode. Furthermore, the injected holes increase the potential of the channel region, so that a potential breakdown can be caused between the source region and the channel region, resulting in causing the kink phenomenon and the like.

However, in the semiconductor device of this embodiment, hole injected into the channel forming region 23a of the active area 23 flow through the channel region connecting portion 11b in the semiconductor substrate 11 to the lower portion of the semiconductor substrate 11, and hence, the potential of the channel forming region 23a cannot be increased. Therefore, a potential breakdown is difficult to be caused on the interface between the source region 23b and the channel forming region. As a result, the same effects as those of the first embodiment can be attained, and in addition, the resultant MOS transistor can attain a stable operation.

Now, a modification of the second embodiment will be described with reference to the accompanying drawings.

Figure 8A:
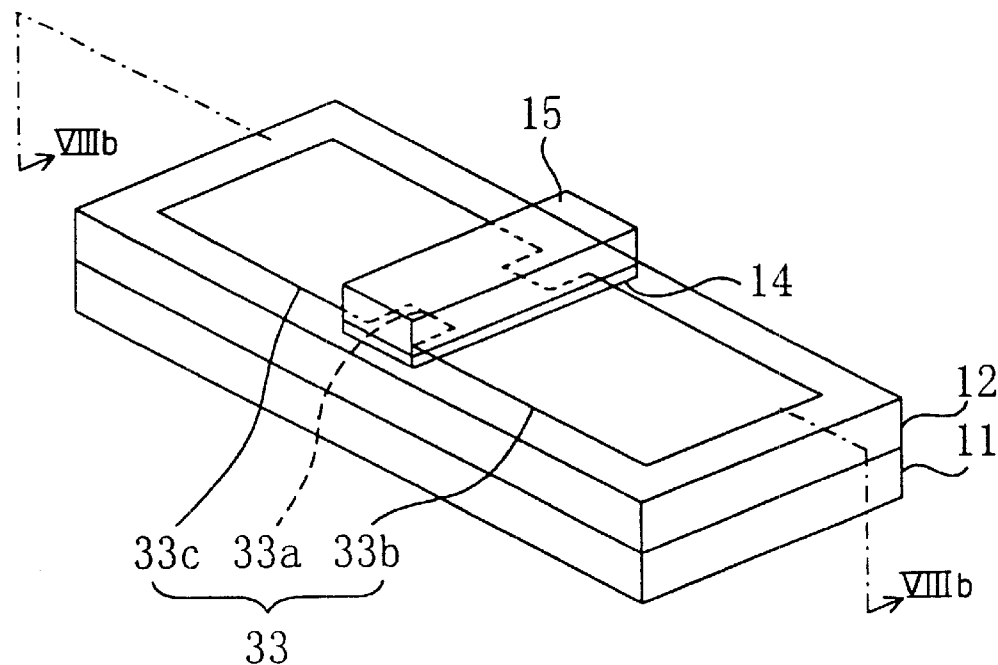
FIG. 8(a) is a perspective view of the semiconductor device of the modification of the second embodiment.
Figure 8B:
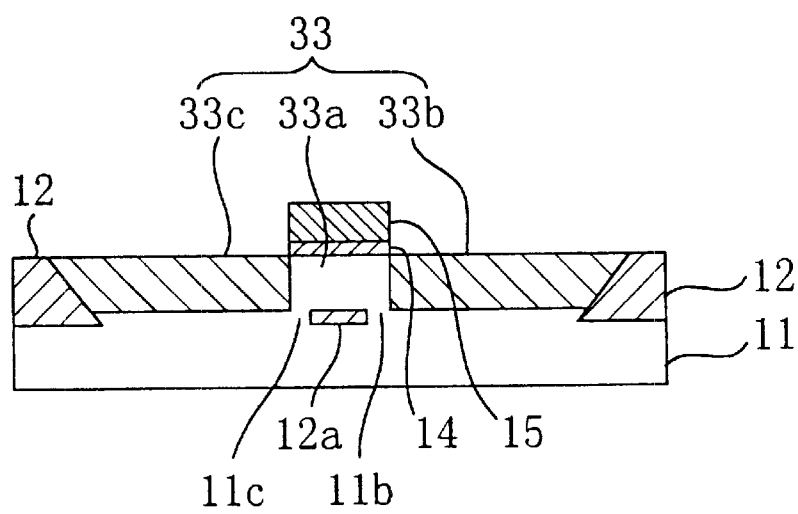
FIG. 8(b) a sectional view taken on line VIIIb—VIIIb of FIG. 8(a)

FIG. 8(a) is a perspective view of a MOS transistor as a semiconductor device of the modification of the second embodiment, and FIG. 8(b) is a sectional view taken on line VIIIb—VIIIb of FIG. 8(a). This semiconductor device is manufactured through the same procedures as those described in the first embodiment, and in FIG. 8(a), like reference numerals are used to refer to like elements shown in FIG. 1 and the description is omitted. As is shown in FIG. 8(a), an active area 33 in a semiconductor substrate 11 includes a channel forming region 33a with a smaller dimension along the gate width, and a source region 33b and a drain region 33c extending along the gate length. The active area 33 is formed by using an active area mask pattern 70 of FIG. 2(c) including a channel forming region portion 70a, a source region portion 70b and a drain region portion 70c.

Figure 2C:
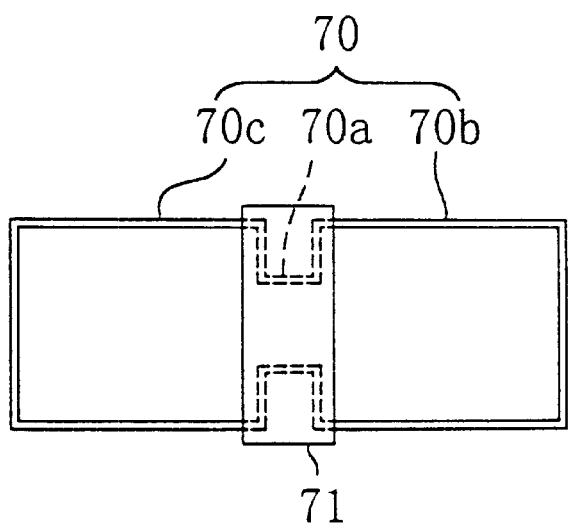
FIG. 2(c) is a plan view of a mask pattern used for a semiconductor device according to a modification of the second embodiment.

As a characteristic of this modification, the source region portion 70b and the drain region portion 70c of the active area mask pattern 70 are overlapped with a gate electrode mask pattern 71 as is shown in FIG. 2(c), and hence, a channel region is formed in an area where the active area mask pattern 70 and the gate electrode mask pattern 71 are overlapped with each other. Therefore, the channel region has a larger channel width at both ends closer to the soure region portion 70b and the drain region portion 70c. Accordingly, as is shown in FIG. 8(b), a channel lower insulating layer 12a, which is formed below the channel forming region 33a of the active area 33 in the semiconductor substrate 11 simultaneously with an isolation area 12, is not connected with the source region 33b and the drain region 33c. This allows the channel forming region 33a in the semiconductor substrate 11 to be connected with an area below the channel lower insulating layer 12 through a first channel region connecting portion 11b and a second channel region connecting portion 11c.

In this manner, also in this modification, holes injected into the channel forming region 33a in the active area 33 flow through the first channel region connecting portion 11b and the second channel region connecting portion 11b to the lower portion of the semiconductor substrate 11. Therefore, the potential of the channel forming region 33a does not increase, and hence, a potential breakdown cannot be caused between the source region and the channel region. Thus, the same effects as those of the first embodiment can be attained, and in addition, the resultant MOS transistor can definitely attain a stable operation.

In the case where merely one of the first channel region connecting portion 11b and the second channel region connecting portion 11c is to be formed, the first channel region connecting portion 11b is more effectively selected because the holes are drawn toward the source region 33b due to a drain bias in an N-channel MOS transistor.

(Embodiment 3)

A third embodiment of the invention will now be described with reference to the accompanying drawings.

Figure 9A:
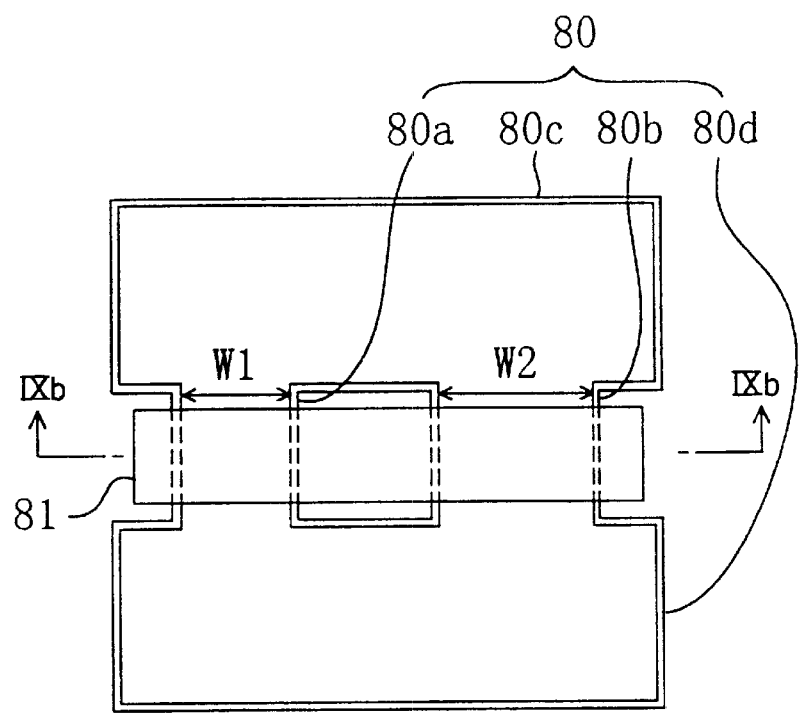
Figure 9B:
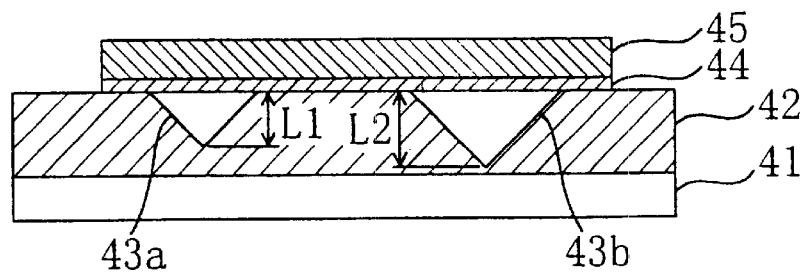

FIGS. 9(a) and 9(b) show a semiconductor integrated device of this embodiment, wherein FIG. 9(a) is a plan view of an active area mask pattern 80 and a gate electrode mask pattern 81, and FIG. 9(b) is a sectional view, taken on line IXb—IXb of FIG. 9(a), of the semiconductor integrated device manufactured by using the mask patterns of FIG. 9(a). As is shown in FIG. 9(a), the active area mask pattern 80 has an opening and has a smaller dimension along the gate width at substantially the center thereof, and includes a first channel forming region portion 80a with a channel width W1, a second channel forming region portion 80b with a channel width W2 larger than the channel width W1, and a common source region portion 80c and a common drain region portion 80d formed so as to sandwich the first and second channel forming region portions 80a and 80b.

In the semiconductor integrated device of FIG. 9(b), on a semiconductor substrate 41 of P-type silicon, a first channel forming region 43a for a first semiconductor device, a second channel forming region 43b for a second semiconductor device, and an active area (not shown) including a common source region (not shown) and a common drain region (not shown) extending along the gate length are formed so as to be surrounded with an isolation area 42 of an insulating oxide film and sandwich the isolation area 42 at the center part having the smaller dimension along the gate width. On the isolation area 42, the first channel forming region 43a and the second channel forming region 43b of the active area in the semiconductor substrate 11, a common gate electrode 45 is formed with a gate insulating oxide film 44 sandwiched therebetween.

The semiconductor integrated device of this embodiment is manufactured through the same procedures as those described in the first embodiment. Accordingly, since the channel width W1 of the first channel forming region 43a is smaller than the channel width W2 of the second channel forming region 43b, the first channel forming region 43a has a thickness L1, in the vertical direction to the surface of the substrate, smaller than a thickness L2, in the vertical direction to the surface of the substrate, of the second channel forming region 43b as is shown in FIG. 9(b).

Figure 10:
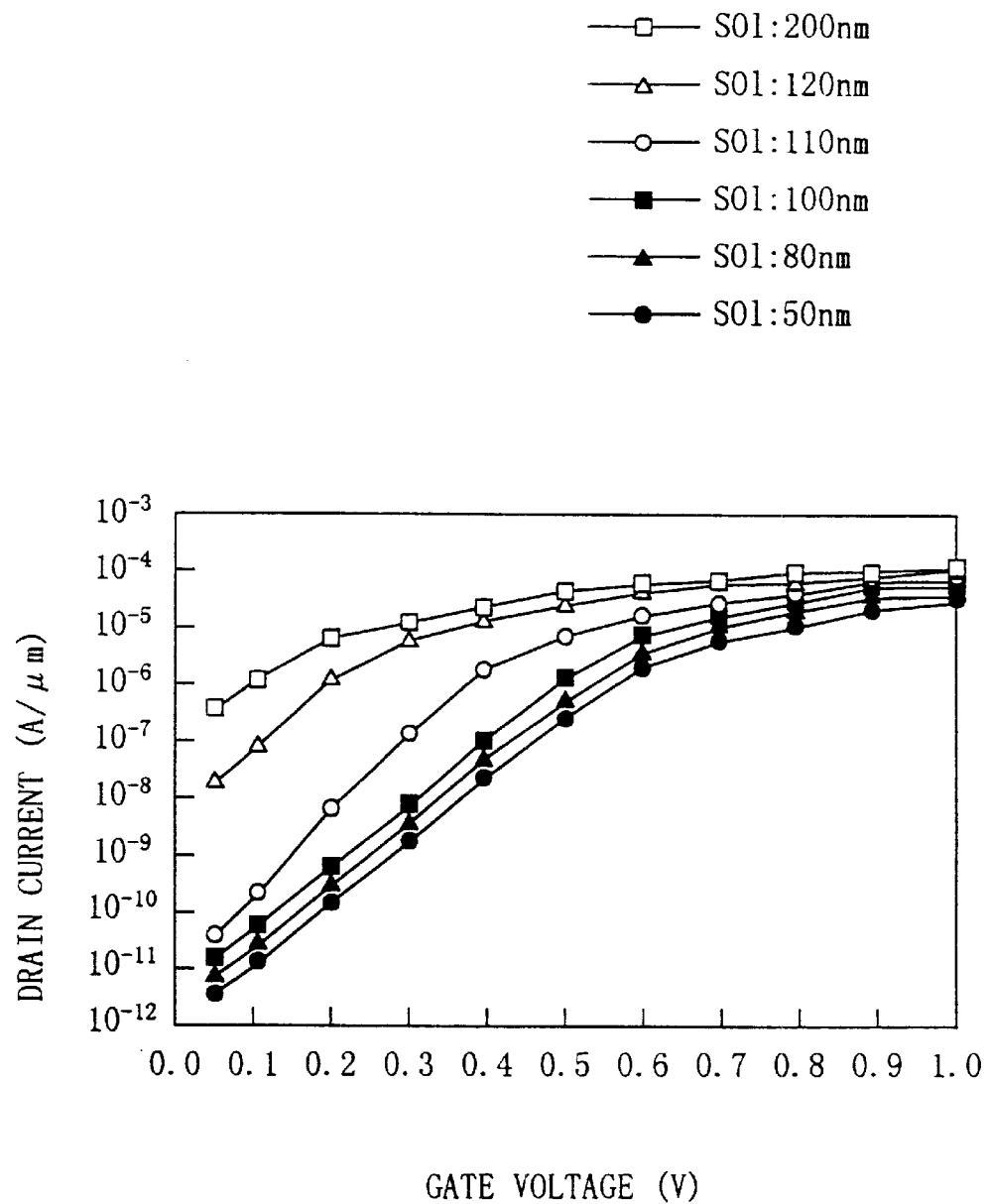
FIG. 10 is a diagram for showing subthreshold characteristics of MOS transistors having various thicknesses of an SOI film in the semiconductor integrated device of the third embodiment.

FIG. 10 shows the relationship between a drain current and a gate voltage in various thicknesses of a channel forming region in a MOS transistor, namely, the subthreshold characteristic of a MOS transistor in various SOI film thicknesses. As is shown in FIG. 10, as the SOI film thickness decreases, the threshold voltage decreases because the drain current increases. In view of this relationship, the threshold voltages of the first semiconductor device closer to the first channel forming region 43a and the second semiconductor device closer to the second channel forming region 43b are set at different values because the thicknesses of the channel forming regions 43a and 43b are different from each other.

As described above, in the semiconductor integrated device of this embodiment, the first channel forming region portion 80a and the second channel forming region portion 80b of the active area mask pattern 80 have the different channel widths W1 and W2, respectively, and hence, the resultant channel forming regions have the different thicknesses L1 and L2, respectively. Thus, when the channel widths of the first channel forming region portion 80a and the second channel forming region portion 80b of the active area mask pattern 80 are different from each other, the transistors having different threshold voltages can be simultaneously formed.

Also, as described in the second embodiment, when the end of the source region or the drain region closer to the gate electrode 45 is overlapped with the gate electrode 45, areas below the channel forming regions 43a and 43b in the semiconductor substrate 41 are allowed to be connected with the semiconductor substrate 41. Thus, a potential breakdown is scarcely caused in the channel region.

Now, a modification of the third embodiment will be described with reference to the accompanying drawings.

Figure 11A:
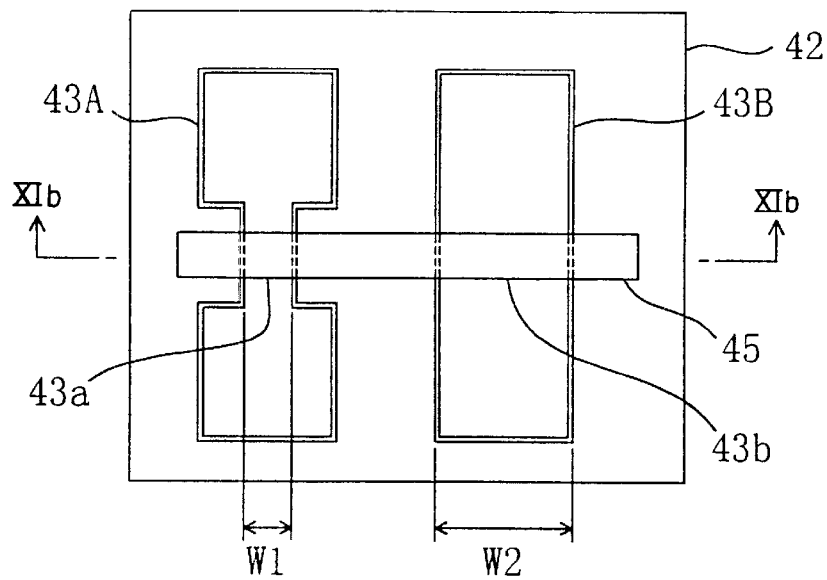
Figure 11B:
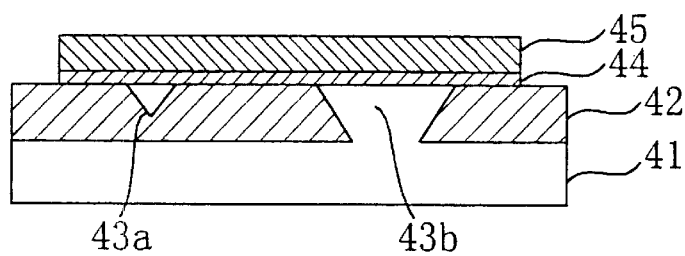
Figure 11C:
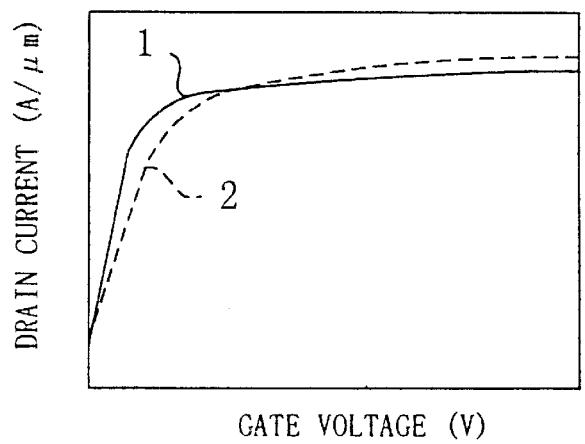

FIGS. 11(a) through 11(c) show a semiconductor integrated device according to the modification of the third embodiment, wherein FIG. 11(a) is a plan view thereof, FIG. 11(b) is a sectional view taken on line XIb—XIb of FIG. 11(a), and FIG. 11(c) shows the subthreshold characteristics thereof. As is shown in FIGS. 11(a) and 11(b), on a semiconductor substrate 41 of P-type silicon, a first active area 43A for a first semiconductor device having a first channel forming region 43a with a smaller dimension along the gate width and a second active area 43B for a second semiconductor device having a second channel forming region 43b in a rectangular shape as in a conventional device are formed so as to be surrounded with an isolation area 42 of an insulating oxide film. On the isolation area 42 on the semiconductor substrate 41, the first channel forming region 43a of the first active area 43A and the second channel forming region 43b of the second active area 43B, a common gate electrode 45 serving as a first gate electrode and a second gate electrode is formed with a gate insulating oxide film 44 sandwiched therebetween.

The semiconductor integrated device of this modification is manufactured through the same procedures as those described in the third embodiment. Furthermore, as is shown in FIG. 11(b), in the first channel forming region 43a of the first active area 43A, an SOI transistor having a channel width W1 is formed so as to be surrounded with the isolation area 42 also at the bottom of the first channel forming region 43a. On the other hand, in the second channel forming region 43b of the second active area 43B, a bulk-type transistor having a channel width W2 is formed so as to allow the lower portion of the second channel formng region 43b to be connected with the lower portion of the semiconductor substrate 41.

Accordingly, as is shown as the subthreshold characteristics in FIG. 11(c), the SOI transistor having the first active area 43A exhibits a characteristic curve 1 with an improved rising characteristic as compared with a characteristic curve 2 of the bulk-type transistor having the second active area 43B. Therefore, the threshold voltage can be decreased without increasing a leakage current, and hence, the supply voltage can be decreased. In contrast, since the channel width W1 of the SOI transistor is smaller than the channel width W2 of the bulk-type transistor, the SOI transistor has a smaller driving current than the bulk-type transistor.

Figure 12:
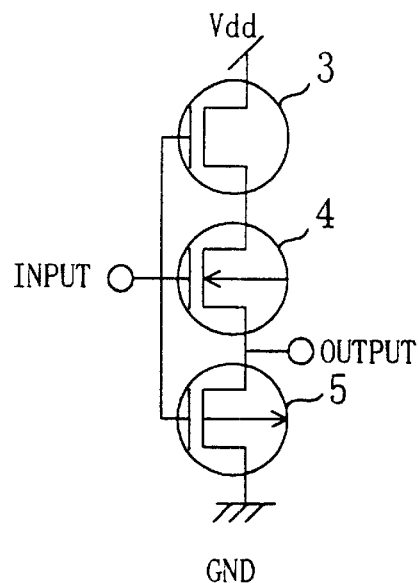
FIG. 12 is a circuit diagram including the semiconductor integrated device of the modification of the third embodiment.
Figure 13:
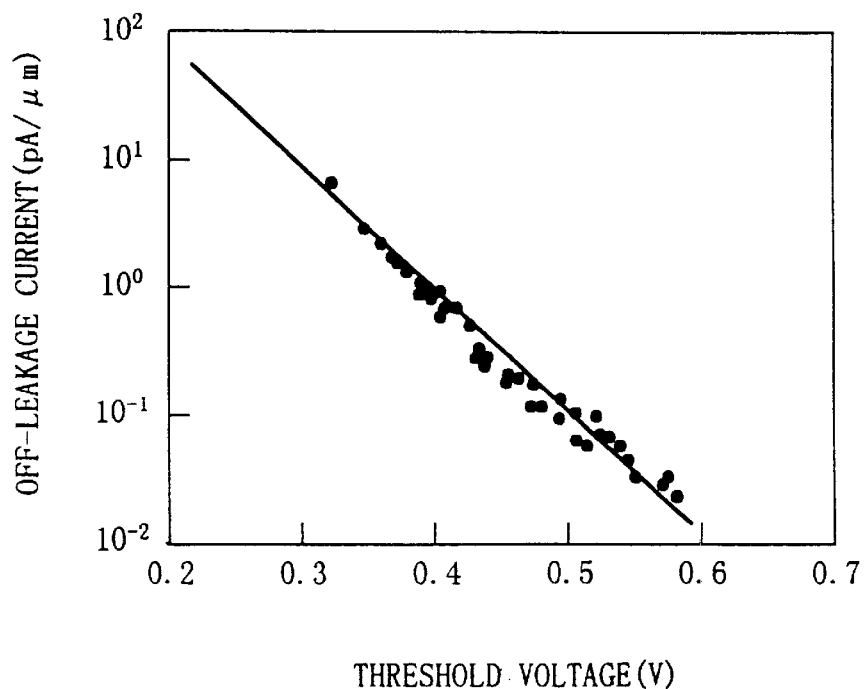
FIG. 13 is a graph showing the relationship between an off-leakage current and a threshold voltage in a MOS transistor.

FIG. 12 shows a circuit configured by using the semiconductor integrated device of this modification. This circuit comprises an N-channel SOI transistor 3, which is connected with an input terminal at its gate electrode and connected with a supply voltage Vdd at its drain electrode, an N-channel bulk-type transistor 4, which is connected with the input terminal at its gate electrode, connected with the source electrode of the N-channel SOI transistor 3 at its drain electrode and connected with an output terminal at its source electrode, and a P-channel bulk-type transistor 5, which is connected with the input terminal at its gate electrode, connected with the output terminal at its source electrode and grounded at its drain electrode.

In this manner, when the SOI transistor having a small off-leakage current and a low threshold voltage is used as a transistor for loading, so as to be combined with the bulk-type transistors 4 and 5 having a high driving ability, the resultant circuit can easily attain the advantages alone of the SOI transistor 3 and the bulk-type transistors 4 and 5.

Also, as described in the second embodiment, when the end of the source region or the drain region closer to the gate electrode 45 is overlapped with the gate electrode 45 in the SOI transistor 3, an area below the first channel forming region 43a of the first semiconductor device can be connected with the semiconductor substrate 41. Thus, a potential breakdown can be scarcely caused in the channel region.

What is claimed is:

1. A semiconductor integrated device comprising:
   a semiconductor device formed on a semiconductor substrate, wherein the semiconductor device includes:
   an isolation area formed in the semiconductor substrate;
   an active area formed on the semiconductor substrate surrounded with the isolation area, the active area includes a channel forming region, a source region and a drain region which are arranged along a gate length such that the channel forming region is interposed between the source region and the drain region, said channel forming region having a dimension along a gate width which is smaller than a dimension along a gate width of each of the source region and the drain region;
   a gate electrode formed on the channel forming region; and
   a channel lower insulating layer formed in an area below the channel forming region with a distance from the isolation area disposed at both sides thereof along the gate length,
   wherein a length of said channel forming region taken along a line perpendicular to said gate width and parallel to a plane formed by said source region, said drain region and said channel forming region is greater than the length of said gate electrode taken in the same direction,
   wherein said source region and said drain region have an identical planar shape with respect to said channel forming region, and
   wherein a dimension of said channel lower insulating layer along the gate length is greater than the gate length of said gate electrode.

2. The semiconductor integrated device of claim 1, wherein the channel lower insulating layer is formed such that the channel lower insulating layer, a channel region formed below the gate electrode, and an area below the channel lower insulating layer in the semiconductor substrate are mutually connected.

3. The semiconductor integrated circuit device of claim 1, wherein an upper portion of said channel forming region has a rectangular configuration.

4. A semiconductor integrated device comprising:
   a semiconductor device formed on a semiconductor substrate, wherein the semiconductor device includes:
   an isolation area formed in the semiconductor substrate;
   an active area formed on the semiconductor substrate surrounded with the isolation area, the active area includes a channel forming region, a source region and a drain region which are arranged along a gate length such that the channel forming region is interposed between the source region and the drain region, said channel forming region having a dimension along a gate width which is smaller than a dimension along a gate width of each of the source region and the drain region;
   a gate electrode formed on the channel forming region; and
   a channel lower insulating layer formed in an area below the channel forming region with a distance from the isolation area disposed at both sides thereof along the gate length,
   wherein a cross section along the gate width in the channel forming region has an inverted triangular shape with the vertex in the bottom part of the semiconductor substrate.

5. A semiconductor integrated device comprising:
a semiconductor device formed on a semiconductor substrate, wherein the semiconductor device includes:
   an isolation area formed in the semiconductor substrate;
   an active area formed on the semiconductor substrate surrounded with the isolation area, the active area includes a channel forming region, a source region and a drain region which are arranged along a gate length such that the channel forming region is interposed between the source region and the drain region, said channel forming region having a dimension along a gate width which is smaller than a dimension along a gate width of each of the source region and the drain region;
   a gate electrode formed on the channel forming region; and
   a channel lower insulating layer formed in an area below the channel forming region with a distance from the isolation area disposed at both sides thereof along the gate length,
   wherein a length of said channel forming region taken along a line perpendicular to said gate width and parallel to a plane formed by said source region, said drain region and said channel forming region is greater than the length of said gate electrode taken in the same direction,
   wherein the channel lower insulating layer is formed below the channel forming region with the isolation area disposed at both sides thereof along the gate width.

6. A semiconductor integrated device comprising:
a first semiconductor device formed on a semiconductor substrate, wherein the first semiconductor device includes:
   an isolation area formed in the semiconductor substrate;
   a first active area formed on the semiconductor substrate surrounded with the isolation area, the first active area includes a first channel forming region, a first source region and a first drain region which are arranged along a gate length such that the first channel forming region is interposed between the first source region and the first drain region, said first channel forming region having a dimension along a gate width which is smaller than a dimension along a gate width of each of the first source region and the first drain region;
   a first gate electrode formed on the first channel forming region; and
   a channel lower insulating layer formed in an area below the first channel forming region with a distance from the isolation area disposed at both sides thereof along the gate length, and
a second semiconductor device formed on the substrate,
wherein the second semiconductor device includes:
   a second active area formed on the semiconductor substrate surrounded with the isolation area, the second active area includes a second channel forming region, a second source region and a second drain region which are arranged along a gate length such that the second channel forming region is interposed between the second source region and the second drain region, said second channel forming region having a dimension along the gate width which is larger than the dimension of the first channel forming region; and
   a second gate electrode formed on the second channel forming region,
   wherein an area below the second channel forming region is directly connected to a bottom part of the semiconductor substrate.

7. The semiconductor integrated device of claim 6, wherein the first semiconductor device is a SOI transistor and the second semiconductor device is a bulk-type transistor.

8. A semiconductor integrated device comprising:
a semiconductor device formed on a semiconductor substrate, wherein the semiconductor device includes:
   an isolation area formed in the semiconductor substrate;
   an active area formed on the semiconductor substrate surrounded with the isolation area, the active area includes a channel forming region, a source region and a drain region which are arranged along a gate length such that the channel forming region is interposed between the source region and the drain region, said channel forming region having a dimension along a gate width which is smaller than a dimension along a gate width of each of the source region and the drain region;
   a gate electrode formed on the channel forming region; and
   a channel lower insulating layer formed in an area below the channel forming region with a distance from the isolation area disposed at both sides thereof along the gate length,
   wherein a length of said channel forming region taken along a line perpendicular to said gate width and parallel to a plane formed by said source region, said drain region and said channel forming region is greater than the length of said gate electrode taken in the same direction, and
   wherein a dimension of said channel lower insulating layer along the gate length is greater than the gate length of said gate electrode.

* * * * *